(12) United States Patent
Das et al.

(10) Patent No.: US 10,976,825 B2
(45) Date of Patent: Apr. 13, 2021

(54) METHODS AND APPARATUSES FOR CONTROLLING OPERATION OF A VIBRATIONAL OUTPUT SYSTEM AND/OR OPERATION OF AN INPUT SENSOR SYSTEM

(71) Applicant: Cirrus Logic International Semiconductor Ltd., Edinburgh (GB)

(72) Inventors: Tejasvi Das, Austin, TX (US); Matthew Beardsworth, Austin, TX (US); Michael Allan Kost, Austin, TX (US); Gavin McVeigh, Edinburgh (GB); Hamid Sepehr, Edinburgh (GB); Carl L. Ståhl, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/660,444

(22) Filed: Oct. 22, 2019

(65) Prior Publication Data
US 2020/0387224 A1 Dec. 10, 2020

Related U.S. Application Data

(60) Provisional application No. 62/858,437, filed on Jun. 7, 2019.

(51) Int. Cl.
*G08B 6/00* (2006.01)
*G06F 3/01* (2006.01)
(Continued)

(52) U.S. Cl.
CPC ............ *G06F 3/016* (2013.01); *B06B 1/0207* (2013.01); *B06B 1/045* (2013.01); *G08B 6/00* (2013.01); *B06B 2201/53* (2013.01)

(58) Field of Classification Search
CPC ........ G06F 3/016; G06F 3/0418; G06F 3/041; G06F 3/04184; B06B 1/0207;
(Continued)

(56) References Cited

U.S. PATENT DOCUMENTS 4,902,136 A 2/1990 Mueller et al.
5,684,722 A 11/1997 Thorner et al.
(Continued)

FOREIGN PATENT DOCUMENTS

AU 2002347829 4/2003
CN 103165328 A 6/2013
(Continued)

OTHER PUBLICATIONS

International Search Report and Written Opinion of the International Searching Authority, International Application No. PCT/GB2019/050770, dated Jul. 5, 2019.
(Continued)

*Primary Examiner* — Anh V La
(74) *Attorney, Agent, or Firm* — Jackson Walker L.L.P.

(57) ABSTRACT

Embodiments described herein relate to methods and apparatuses for controlling an operation of a vibrational output system and/or an operation of an input sensor system, wherein the controller is for use in a device comprising the vibrational output system and the input sensor system. A controller comprises an input configured to receive an indication of activation or de-activation of an output of the vibrational output system; and an adjustment module configured to adjust the operation of the vibrational output system and/or the operation of the input sensor system based on the indication to reduce an interference expected to be caused by the output of the vibrational output system on the input sensory system.

22 Claims, 10 Drawing Sheets

(51) Int. Cl.
B06B 1/04 (2006.01)
B06B 1/02 (2006.01)

(58) Field of Classification Search
CPC ... B06B 1/045; B06B 2201/53; B06B 1/0261; B06B 1/0688; G08B 6/00; H02N 2/00
USPC ......... 340/407.2, 407.1, 693.5; 345/173, 174
See application file for complete search history.

(56) References Cited

U.S. PATENT DOCUMENTS

| | | |
|---|---|---|
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,332,029 B1 | 12/2001 | Azima et al. |
| 6,388,520 B2 | 5/2002 | Wada et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,906,697 B2 | 6/2005 | Rosenberg |
| 6,995,747 B2 | 2/2006 | Casebolt et al. |
| 7,154,470 B2 | 12/2006 | Tierling |
| 7,623,114 B2 | 11/2009 | Rank |
| 7,639,232 B2 | 12/2009 | Grant et al. |
| 7,791,588 B2 | 9/2010 | Tierling et al. |
| 7,979,146 B2 | 7/2011 | Ulrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,593,269 B2 | 11/2013 | Grant et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,947,216 B2 | 2/2015 | Da Costa et al. |
| 8,981,915 B2 | 3/2015 | Bimbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,697,450 B1 | 7/2017 | Lee |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,946,348 B2 | 4/2018 | Saboune et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,055,950 B2 | 8/2018 | Bhatia et al. |
| 10,074,246 B2 | 9/2018 | Da Costa et al. |
| 10,110,152 B1 | 10/2018 | Hajati |
| 10,171,008 B2 | 1/2019 | Nishitani et al. |
| 10,175,763 B2 | 1/2019 | Shah |
| 10,264,348 B1 | 4/2019 | Harris et al. |
| 10,447,217 B2 | 10/2019 | Zhao et al. |
| 10,564,727 B2 | 2/2020 | Billington et al. |
| 10,620,704 B2 | 4/2020 | Rand et al. |
| 10,732,714 B2 | 8/2020 | Rao et al. |
| 10,782,785 B2 | 9/2020 | Hu et al. |
| 10,795,443 B2 | 10/2020 | Hu et al. |
| 10,828,672 B2 | 11/2020 | Stahl et al. |
| 10,832,537 B2 | 11/2020 | Doy et al. |
| 2002/0018578 A1 | 2/2002 | Burton |
| 2003/0068053 A1 | 4/2003 | Chu |
| 2003/0214485 A1 | 11/2003 | Roberts |
| 2006/0028095 A1 | 2/2006 | Maruyama et al. |
| 2006/0284856 A1 | 12/2006 | Soss |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0079690 A1 | 3/2009 | Watson et al. |
| 2009/0088220 A1 | 4/2009 | Persson |
| 2009/0102805 A1 | 4/2009 | Meijer et al. |
| 2009/0153499 A1 | 6/2009 | Kim et al. |
| 2010/0013761 A1* | 1/2010 | Birnbaum ............... G08B 6/00 345/156 |
| 2010/0141408 A1 | 6/2010 | Doy et al. |
| 2011/0056763 A1 | 3/2011 | Tanase et al. |
| 2011/0141052 A1 | 6/2011 | Bernstein et al. |
| 2011/0163985 A1 | 7/2011 | Bae et al. |
| 2011/0167391 A1 | 7/2011 | Momeyer et al. |
| 2012/0105358 A1 | 5/2012 | Momeyer et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0306631 A1 | 12/2012 | Hughes et al. |
| 2013/0027359 A1 | 1/2013 | Schevin et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0118125 A1 | 5/2014 | Bhatia |
| 2014/0119244 A1* | 5/2014 | Steer ............... H04B 1/525 370/278 |
| 2014/0139327 A1 | 5/2014 | Bau et al. |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2015/0061846 A1 | 3/2015 | Yliaho |
| 2015/0070260 A1 | 3/2015 | Saboune et al. |
| 2015/0084752 A1 | 3/2015 | Heubel et al. |
| 2015/0216762 A1 | 8/2015 | Oohashi et al. |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2016/0063826 A1 | 3/2016 | Morrell et al. |
| 2016/0074278 A1 | 3/2016 | Muench et al. |
| 2016/0132118 A1 | 5/2016 | Park et al. |
| 2016/0141606 A1 | 5/2016 | Ahn et al. |
| 2016/0162031 A1 | 6/2016 | Westerman et al. |
| 2016/0179203 A1 | 6/2016 | Modarres et al. |
| 2016/0239089 A1 | 8/2016 | Taninaka et al. |
| 2016/0246378 A1 | 8/2016 | Sampanes et al. |
| 2016/0358605 A1 | 12/2016 | Ganong, III et al. |
| 2017/0078804 A1 | 3/2017 | Guo et al. |
| 2017/0083096 A1 | 3/2017 | Rihn et al. |
| 2017/0090572 A1* | 3/2017 | Holenarsipur ......... G06F 3/0362 |
| 2017/0153760 A1 | 6/2017 | Chawda et al. |
| 2017/0168574 A1* | 6/2017 | Zhang ............... G06F 3/0416 |
| 2017/0220197 A1 | 8/2017 | Matsumoto et al. |
| 2017/0277350 A1 | 9/2017 | Wang et al. |
| 2017/0357440 A1 | 12/2017 | Tse |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |

(56) References Cited

U.S. PATENT DOCUMENTS

| | | |
|---|---|---|
| 2018/0082673 A1 | 3/2018 | Tzanetos |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0160227 A1 | 6/2018 | Lawrence et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0237033 A1 | 8/2018 | Hakeem et al. |
| 2018/0253123 A1 | 9/2018 | Levesque et al. |
| 2018/0321748 A1 | 11/2018 | Rao et al. |
| 2018/0329172 A1 | 11/2018 | Tabuchi |
| 2018/0335848 A1* | 11/2018 | Moussette ............ G06F 3/0488 |
| 2018/0367897 A1 | 12/2018 | Bjork et al. |
| 2019/0227628 A1 | 1/2019 | Rand et al. |
| 2019/0064925 A1 | 2/2019 | Kim et al. |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0215349 A1 | 7/2019 | Adams et al. |
| 2019/0114496 A1 | 8/2019 | Lesso |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 | 10/2019 | Doy et al. |
| 2019/0341903 A1 | 11/2019 | Kim |
| 2020/0218352 A1 | 7/2020 | Macours et al. |

FOREIGN PATENT DOCUMENTS

| | | |
|---|---|---|
| EP | 0784844 B1 | 6/2005 |
| EP | 2363785 A1 | 9/2011 |
| EP | 2600225 A1 | 6/2013 |
| EP | 2846329 A1 | 3/2015 |
| EP | 3125508 A1 | 2/2017 |
| EP | 3379382 A1 | 9/2018 |
| IN | 201747044027 | 8/2018 |
| JP | H02130433 B2 | 5/1990 |
| JP | 08149006 A | 6/1996 |
| JP | 6026751 B2 | 11/2016 |
| JP | 6250985 | 12/2017 |
| JP | 6321351 | 5/2018 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |

OTHER PUBLICATIONS

Combined Search and Examination Report, UKIPO, Application No. GB1720424.9, dated Jun. 5, 2018.

Communication Relating to the Results of the Partial International Search, and Provisional Opinion Accompanying the Partial Search Result, of the International Searching Authority, International Application No. PCT/US2018/031329, dated Jul. 20, 2018.

International Search Report and Written Opinion of the International Searching Authority, International Application No. PCT/GB2019/050964, dated Sep. 3, 2019.

International Search Report and Written Opinion of the International Searching Authority, International Application No. PCT/GB2019/052991, dated Mar. 17, 2020.

International Search Report and Written Opinion of the International Searching Authority, International Application No. PCT/US2020/023342, dated Jun. 9, 2020.

International Search Report and Written Opinion of the International Searching Authority, International Application No. PCT/GB2020/050823, dated Jun. 30, 2020.

Communication Relating to the Results of the Partial International Search, and Provisional Opinion Accompanying the Partial Search Result, of the International Searching Authority, International Application No. PCT/GB2020/050822, dated Jul. 9, 2020.

International Search Report and Written Opinion of the International Searching Authority, International Application No. PCT/GB2020/051037, dated Jul. 9, 2020.

International Search Report and Written Opinion of the International Searching Authority, International Application No. PCT/GB2020/051035, dated Jul. 10, 2020.

International Search Report and Written Opinion of the International Searching Authority, International Application No. PCT/US2020/024864, dated Jul. 6, 2020.

International Search Report and Written Opinion of the International Searching Authority, International Application No. PCT/GB2020/050822, dated Aug. 31, 2020.

International Search Report and Written Opinion of the International Searching Authority, International Application No. PCT/GB2020/051438, dated Sep. 28, 2020.

First Examination Opinion Notice, State Intellectual Property Office of the People's Republic of China, Application No. 201880037435.X, dated Dec. 31, 2020.

International Search Report and Written Opinion of the International Searching Authority, International Application No. PCT/US2020/056610, dated Jan. 21, 2021.

* cited by examiner

METHODS AND APPARATUSES FOR CONTROLLING OPERATION OF A VIBRATIONAL OUTPUT SYSTEM AND/OR OPERATION OF AN INPUT SENSOR SYSTEM

TECHNICAL FIELD

The present disclosure describes methods and apparatuses for the reduction or prevention of interference (e.g. haptic crosstalk) expected to be caused by the output of the vibrational output system on an input sensory system. The input sensory system may comprise, for example, a force sensing input system to provide virtual buttons, or other input sensory system such as an accelerometer, gyroscope, or microphone.

RELATED APPLICATIONS

The present disclosure relates to U.S. patent application Ser. No. 15/722,128 filed Oct. 2, 2017; U.S. patent application Ser. No. 16/267,079 filed Feb. 4, 2019; U.S. patent application Ser. No. 16/294,347 filed Mar. 6, 2019; and U.S. patent application Ser. No. 16/422,543 filed May 24, 2019, all of which are incorporated by reference herein in their entireties.

BACKGROUND

Linear resonant actuators (LRAs) and other vibrational actuators (e.g., rotational actuators, vibrating motors, etc.) are increasingly being used in mobile devices (e.g., mobile phones, personal digital assistants, video game controllers, etc.) or other systems to generate vibrational feedback for user interaction with such devices. Typically, a force/pressure sensor detects user interaction with the device (e.g., a finger press on a virtual button of the device) and in response thereto, the linear resonant actuator vibrates to provide feedback to the user. For example, a linear resonant actuator may vibrate in response to force to mimic to the user the feel of a mechanical button click.

One disadvantage of existing haptic systems is that existing approaches to processing of signals of a force sensor and generating of a haptic response thereto often have longer than desired latency, such that the haptic response may be significantly delayed from the user's interaction with the force sensor. Thus, in applications in which a haptic system is used for mechanical button replacement, capacitive sensor feedback, or other application, and the haptic response may not effectively mimic the feel of a mechanical button click. Accordingly, systems and methods that minimize latency between a user's interaction with a force sensor and a haptic response to the interaction are desired.

In addition, to create appropriate and pleasant haptic feelings for a user, a signal driving a linear resonant actuator may need to be carefully designed and generated. In mechanical button replacement application, a desirable haptic response may be one in which the vibrational impulse generated by the linear resonant actuator should be strong enough to give a user prominent notification as a response to his/her finger pressing and/or releasing, and the vibrational impulse should be short, fast, and clean from resonance tails to provide a user a "sharp" and "crisp" feeling. Optionally, different control algorithms and stimulus may be applied to a linear resonant actuator, to alter the performance to provide alternate tactile feedback—possibly denoting certain user modes in the device—giving more "soft" and "resonant" tactile responses.

SUMMARY

According to some embodiments there is provided a controller for controlling an operation of a vibrational output system and/or an operation of an input sensor system, wherein the controller is for use in a device comprising the vibrational output system and the input sensor system. The controller comprises an input configured to receive an indication of activation or de-activation of an output of the vibrational output system; and an adjustment module configured to adjust the operation of the vibrational output system and/or the operation of the input sensor system based on the indication to reduce an interference expected to be caused by the output of the vibrational output system on the input sensory system.

According to some embodiments there is provided a device. The device comprises an input sensor system; a vibrational output system; a controller configured to control operation of the vibrational output system and/or the input sensor system, wherein the controller comprises: an input configured to receive an indication indicating activation or deactivation of an output of the vibrational output system; and an adjustment module configured to adjust operation of the vibrational output system and/or operation of the input sensor system based on the indication to reduce an interference expected to be caused by the output of the vibrational output system on the input sensory system.

According to some embodiments there is provided an integrated circuit for use in a device comprising an input sensor system and a vibrational output system. The integrated circuit comprising a controller configured to control operation of the vibrational output system and/or the input sensor system, wherein the controller comprises: an input configured to receive an indication of whether an output of the vibrational output system is active; and an adjustment module configured to adjust operation of the vibrational output system and/or operation of the input sensor system based on the indication.

According to some embodiments there is provided a method for use in a device comprising a vibrational output system and an input sensor system for controlling operation of the vibrational output system and/or the input sensor system. The method comprises receiving an indication of whether an output of the vibrational output system is active; and adjusting operation of the vibrational output system and/or operation of the input sensor system based on the indication to reduce an interference expected to be caused by the output of the vibrational output system on the input sensory system.

According to some embodiments there is provided a controller for outputting an output signal to a vibrational output system for use in a device comprising the vibrational output system and an input sensor system. The controller comprises an input for receiving an input signal; and a filter for filtering the input signal to provide the output signal; wherein the filter is configured to filter the input signal based on an operating or carrier frequency associated with the input sensor system. In some embodiments, the controller further comprises an input configured to receive an indication of the operating or carrier frequency of the input sensor system, and an adjustment module configured to dynamically adjust the filtering of the filter based on the indication of the operating or carrier frequency of the input sensor system.

According to some embodiments there is provided a controller for outputting an output signal to a vibrational output system for use in a device comprising the vibrational output system and an input sensor system. The controller comprises a processing block configured to output the output signal, wherein the processing block is configured such that integer harmonic tones of the output signal fall outside a frequency band associated with operation of the input sensor system. In some embodiments the processing block comprises an output pulse width modulation, PWM, amplifier. In some embodiments the controller further comprises an input configured to receive an indication of the frequency band associated with operation of the input sensor system; and an adjustment module configured to dynamically adjust the operation of the processing block based on the received indication such that integer harmonic tones of the output signal fall outside the frequency band associated with operation of the input sensor system.

BRIEF DESCRIPTION OF THE DRAWINGS

For a better understanding of the embodiments of the present disclosure, and to show how it may be put into effect, reference will now be made, by way of example only, to the accompanying drawings, in which.

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The methods described herein can be implemented in a wide range of devices and systems, for example a mobile telephone, an audio player, a video player, a mobile computing platform, a games device, a remote controller device, a toy, a machine, or a home automation controller or a domestic appliance. However, for ease of explanation of one embodiment, an illustrative example will be described in FIG. 1, in which the implementation occurs in a mobile device 102.

Figure 1:
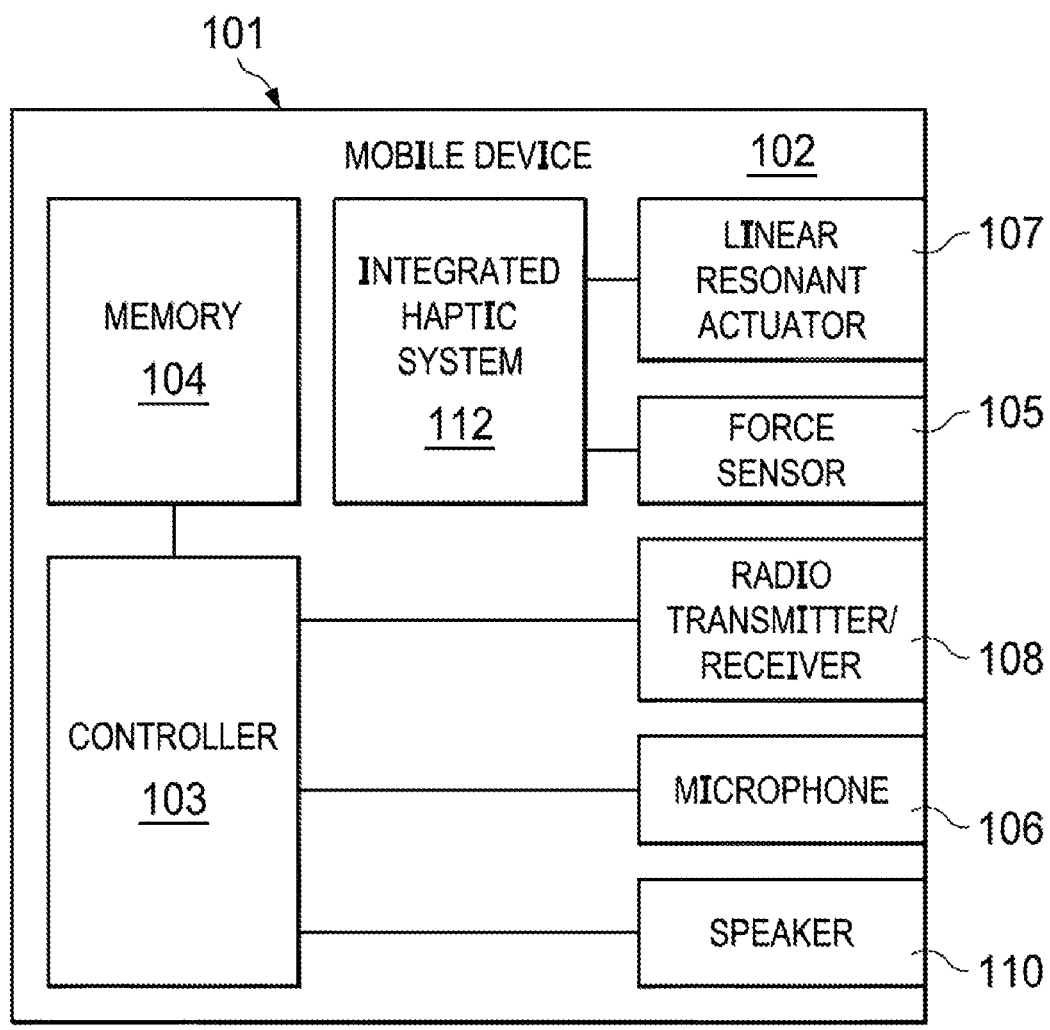
FIG. 1 illustrates a block diagram of selected components of an example mobile device.

FIG. 1 illustrates a block diagram of selected components of an example mobile device 102, in accordance with embodiments of the present disclosure. As shown in FIG. 1, the mobile device 102 may comprise an enclosure 101, a controller 103, a memory 104, a input sensor system 105 (which in this example comprises a force sensor), a microphone 106, a vibrational output system 107 (which in this example comprises a linear resonant actuator (LRA)), a radio transmitter/receiver 108, a speaker 110, and an integrated haptic system 112. It will be understood that any suitable vibrational actuators arranged to provide a haptic vibration effect (e.g., rotational actuators such as ERMs, vibrating motors, etc.) may be used as an alternative to or in addition to the LRA 107.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102. While FIG. 1 illustrates a mobile device, it will be understood that the illustrated systems may be utilized in other device types, e.g. user-interactable display technology, automotive computing systems, etc.

Controller 103 may be housed within enclosure 101 and may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 103 interprets and/or executes program instructions and/or processes data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, 5G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

The input sensor system 105 may be housed within, be located on or form part of the enclosure 101 and may be communicatively coupled to the controller 103. In this example, the input sensor system 105 comprises a force sensor system, and each force sensor of the force sensor system 105 may include any suitable system, device, or apparatus for sensing a force, a pressure, or a touch (e.g., an interaction with a human finger) and for generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general-purpose input/output signal (GPIO) associated with an input signal to which haptic feedback is given.

Example force sensors may include or comprise:
capacitive displacement sensors,
inductive force sensors,
strain gauges,
piezoelectric force sensors,
force sensing resistors,
piezoresistive force sensors,
thin film force sensors, and
quantum tunneling composite-based force sensors.

In some arrangements, other types of sensor may be employed. For purposes of clarity and exposition in this disclosure, the term "force" as used herein may refer not only to force, but to physical quantities indicative of force or analogous to force, such as, but not limited to, pressure and touch.

In this example, vibrational output system 107 comprises a Linear resonant actuator 107 which may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from integrated haptic system 112, may render haptic feedback to a user of mobile device 102 for at least one of mechanical button replacement and capacitive sensor feedback.

Integrated haptic system 112 may be housed within enclosure 101, may be communicatively coupled to input sensor system 105 and vibrational output system 107, and may include any system, device, or apparatus configured to receive a signal from input sensor system 105 indicative of a force applied to mobile device 102 (e.g., a force applied by a human finger to a virtual button of mobile device 102) and generate an electronic signal for driving linear resonant actuator 107 in response to the force applied to mobile device 102.

Although specific example components are depicted above as being integral to mobile device 102 (e.g., controller 103, memory 104, user interface 105, microphone 106, radio transmitter/receiver 108, speakers(s) 110), a mobile device 102 in accordance with this disclosure may comprise one or more components not specifically enumerated above. For example, although FIG. 1 depicts certain user interface components, mobile device 102 may include one or more other user interface components in addition to those depicted in the above figure, including but not limited to a keypad, a touch screen, and a display, thus allowing a user to interact with and/or otherwise manipulate mobile device 102 and its associated components.

In addition, it will be understood that the input sensor system 105 may comprise additional or alternative input sensor devices or transducers, for example accelerometers, gyroscopes, cameras, or other sensor devices.

Figure 2:
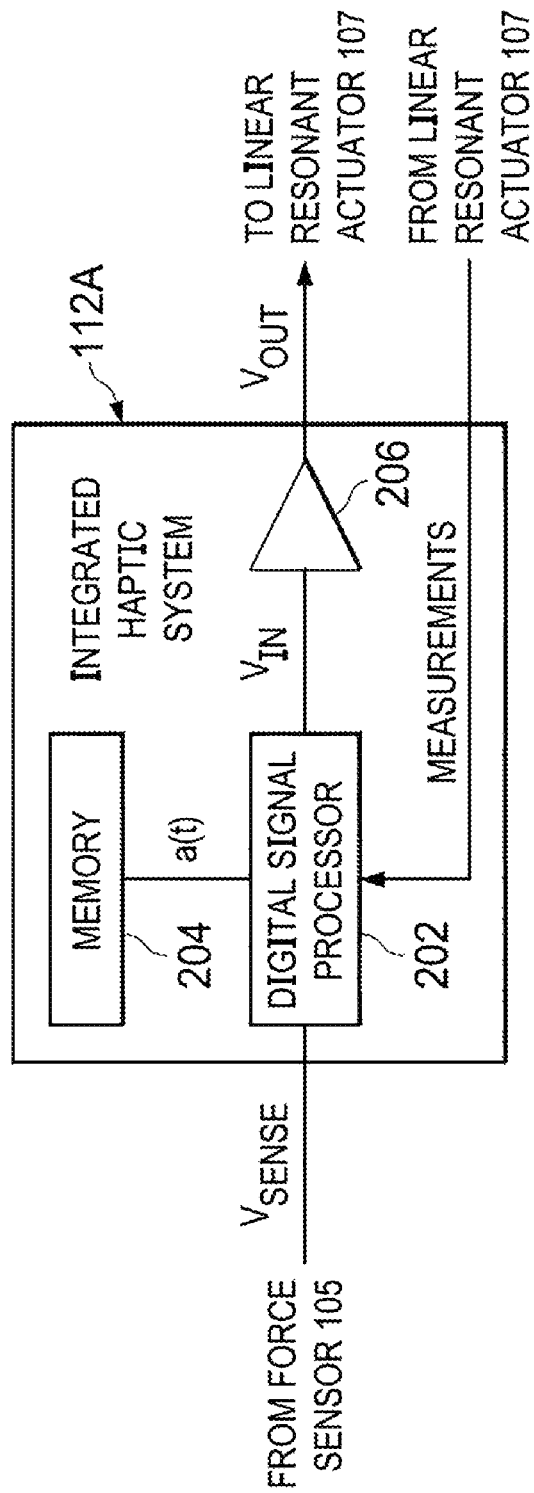
FIG. 2 illustrates a block diagram of selected components of an example integrated haptic system.

FIG. 2 illustrates a block diagram of selected components of an example integrated haptic system 112A, in accordance with embodiments of the present disclosure. In some embodiments, integrated haptic system 112A may be used to implement the integrated haptic system 112 of FIG. 1. As shown in FIG. 2, integrated haptic system 112A may include a controller (which in this example comprises a digital signal processor (DSP)) 202, a memory 204, and an amplifier 206.

DSP 202 may include any system, device, or apparatus configured to interpret and/or execute program instructions and/or process data. In some embodiments, DSP 202 may interpret and/or execute program instructions and/or process data stored in memory 204 and/or other computer-readable media accessible to DSP 202. The DSP 202 operates as a controller for the integrated haptic system 112A.

Memory 204 may be communicatively coupled to DSP 202, and may include any system, device, or apparatus configured to retain program instructions and/or data for a period of time (e.g., computer-readable media). Memory 204 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Amplifier 206 may be electrically coupled to DSP 202 and may comprise any suitable electronic system, device, or apparatus configured to increase the power of an input signal VIN (e.g., a time-varying voltage or current) to generate an output signal VOUT. For example, amplifier 206 may use electric power from a power supply (not explicitly shown) to increase the amplitude of a signal. Amplifier 206 may include any suitable amplifier class, including without limitation, a Class-D amplifier.

In operation, memory 204 may store one or more haptic playback representations. A haptic playback representation may comprise a waveform. In some examples, a haptic playback representation may comprise one or more parameters, for example, frequency amplitude and duration, allowing for the determination of a haptic waveform based on the parameters. In some embodiments, each of the one or more haptic playback representations may define a haptic response a(t) as a desired acceleration of a linear resonant actuator (e.g., linear resonant actuator 107) as a function of time.

The controller or DSP 202 is configured to receive a force signal VSENSE from force sensor system 105 indicative of force applied to at least one force sensor of the force sensor system 105. Either in response to receipt of force signal VSENSE indicating a sensed force or independently of such receipt, DSP 202 may retrieve a haptic playback representation from memory 104 and may process the haptic playback representation to determine a processed haptic playback signal VIN. In embodiments in which amplifier 206 is a Class D amplifier, processed haptic playback signal VIN may comprise a pulse-width modulated signal. In response to receipt of force signal VSENSE indicating a sensed force, DSP 202 may cause processed haptic playback signal VIN to be output to amplifier 206, and amplifier 206 may amplify processed haptic playback signal VIN to generate a haptic output signal VOUT for driving linear resonant actuator 107.

In some embodiments, integrated haptic system 112A may be formed on a single integrated circuit, thus enabling lower latency than existing approaches to haptic feedback control. By providing integrated haptic system 112A as part of a single monolithic integrated circuit, latencies between various interfaces and system components of integrated haptic system 112A may be reduced or eliminated.

For devices having input transducers, for example resistive or inductive force sensors, or other input sensor systems such as microphones, accelerometers, gyroscopes, optical sensors, etc., the system may be configured such that any effect or interference expected to be caused by the vibrational output on the input sensor system is reduced. This may be done by controlling the operation of the vibrational output, controlling the operation of the input sensor system, and/or controlling the processing of signals produced by the input sensor system to reduce the effect of any vibrational-related crosstalk.

Inductive Sense in Human-Machine Interface (HMI) Systems

In an example embodiment, the input sensor system may comprise a system configured to measure the variation in the inductance of a coil referred to as an inductive sensing system. The inductive sensing system may form part of a Human-Machine Interface (HMI).

Figure 3:
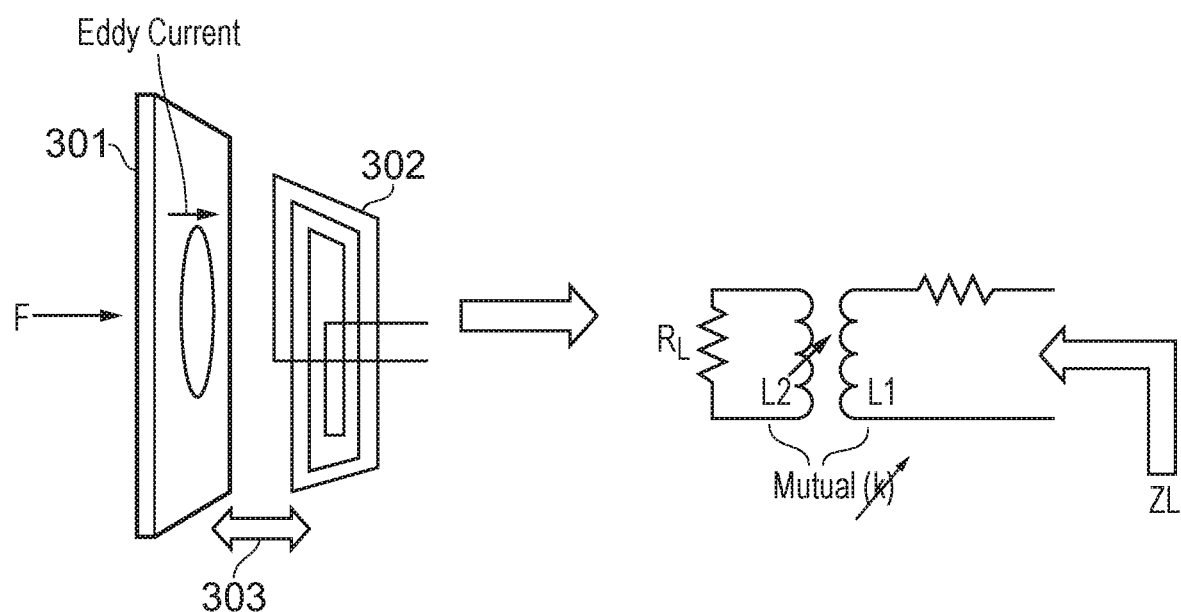
FIG. 3 illustrates an example inductive sensing system.

FIG. 3 illustrates an example inductive sensing system. The inductive sensing system comprises a metal plate 301 and inductor 302 located at a certain distance 303. When a current (I) passes through the inductor 302, the magnetic field induces Eddy currents inside the metal plate 301. When a force, F, is applied to the metal plate, the forces changes the distance 303 from the metal plate 301 to the inductor 302, and changes the coupling between the inductor 302 and metal plate 301. In this case, the coupling coefficient k, inductor L2 and lossy resistance RL in the model of the inductive sensing system changes. The change in distance 303, in turn, modifies the effective impedance looking into the inductor (ZL).

In such an inductive sensing system, a force or mechanical movement in the metal place will result in a change in inductance.

Figure 4:
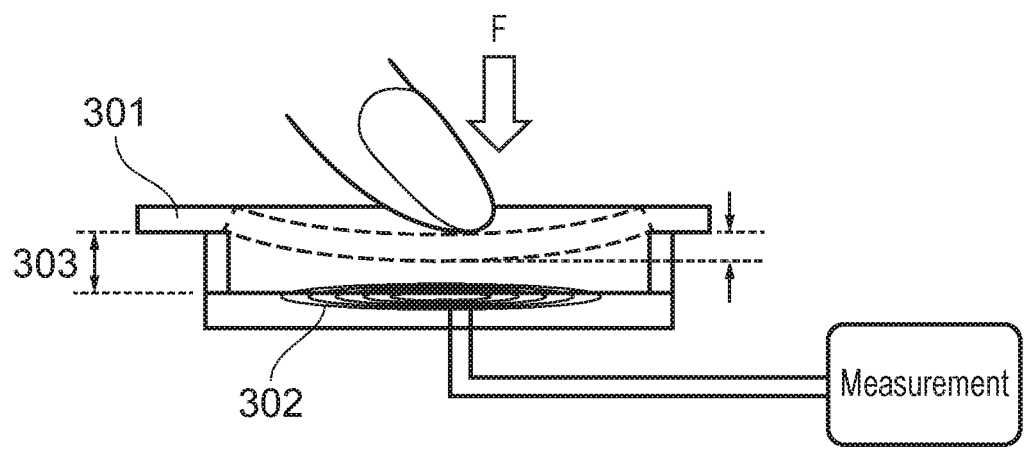
FIG. 4 illustrates a virtual button implemented using an inductive sensing system such as the system illustrated in FIG. 3.

FIG. 4 illustrates a virtual button implemented using an inductive sensing system such as the system illustrated in FIG. 3.

When such inductive sensing systems are used as part of an HMI system, haptic feedback may be included in the HMI system to provide user tactile feedback based on the amount/duration of pressure applied. Examples of such a HMI interface may include, but are not limited to virtual button systems, volume sliders, power/home buttons in electronic devices.

Figure 5:
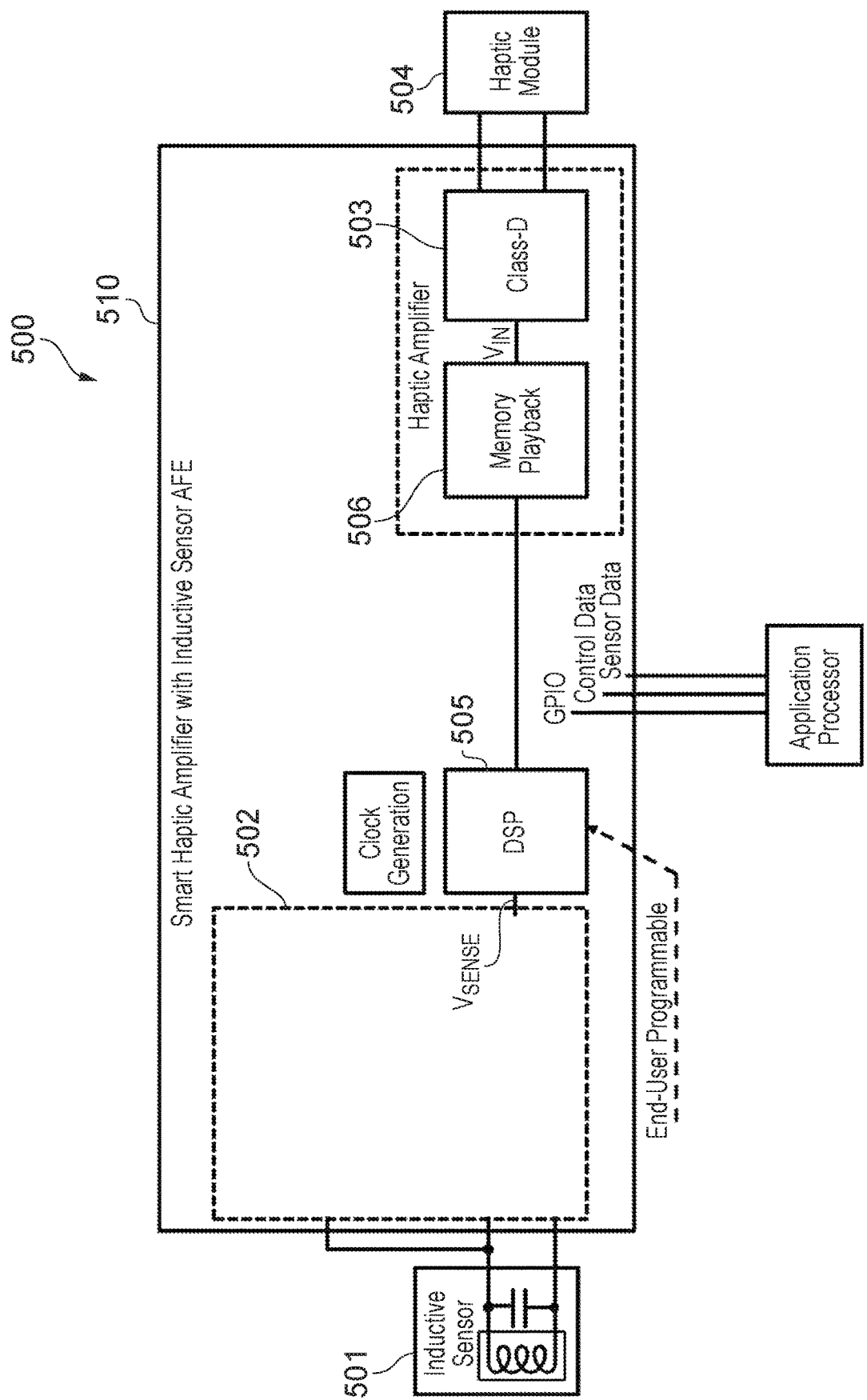
FIG. 5 illustrates a Human-Machine Interface (HMI) system comprising an integrated haptic system.

FIG. 5 illustrates an HMI system 500 comprising an integrated haptic system 510. The integrated haptic system 112A of FIG. 2 may comprise the integrated haptic system 510. The HMI system 500 comprises of three main subsystems: an RLC sensor 501, an inductive sensing analog front end (AFE) 502 with post-processing, and a haptic amplifier 503 that is connected to the sensing sub-system. The haptic amplifier 503 provides tactile feedback to the user through the haptic module 504, e.g. an LRA or similar. As described with reference to FIG. 2, controller 505 (which may comprise a DSP) may be configured to control operation of the haptic amplifier 503. In particular, the DSP 505 may be configured to receive a force signal $V_{SENSE}$ from IS AFE 502 indicative of force applied to the inductive sensor 501. Either in response to receipt of force signal $V_{SENSE}$ indicating a sensed force or independently of such receipt, the DSP 505 may retrieve a haptic playback representation from memory 506 and may process the haptic playback representation to determine a processed haptic playback signal VIN.

In systems such as those mentioned above, it may be advantageous to ensure that the vibrational output system (for example a haptic amplifier and module, or a surface audio system) does not interfere or affect the functionality of the inductive sensing system. For example, when actively vibrating, energy may couple from the vibrational output system back to the inductive sensing system or the sensor, thereby affecting the detection accuracy of the inductive sensing system or the sensor. It will be understood that the general structure of the above-described smart haptic amplifier with an integrated inductive force sensing front end may apply for a system with an integrated input sensor system (e.g. resistive force sensing) front end.

It will also be appreciated that a vibrational output system may have a similar interfering effect on other types of input sensor system, for example camera systems, optical systems, microphones etc.

Inductive Sensing

Figure 6:
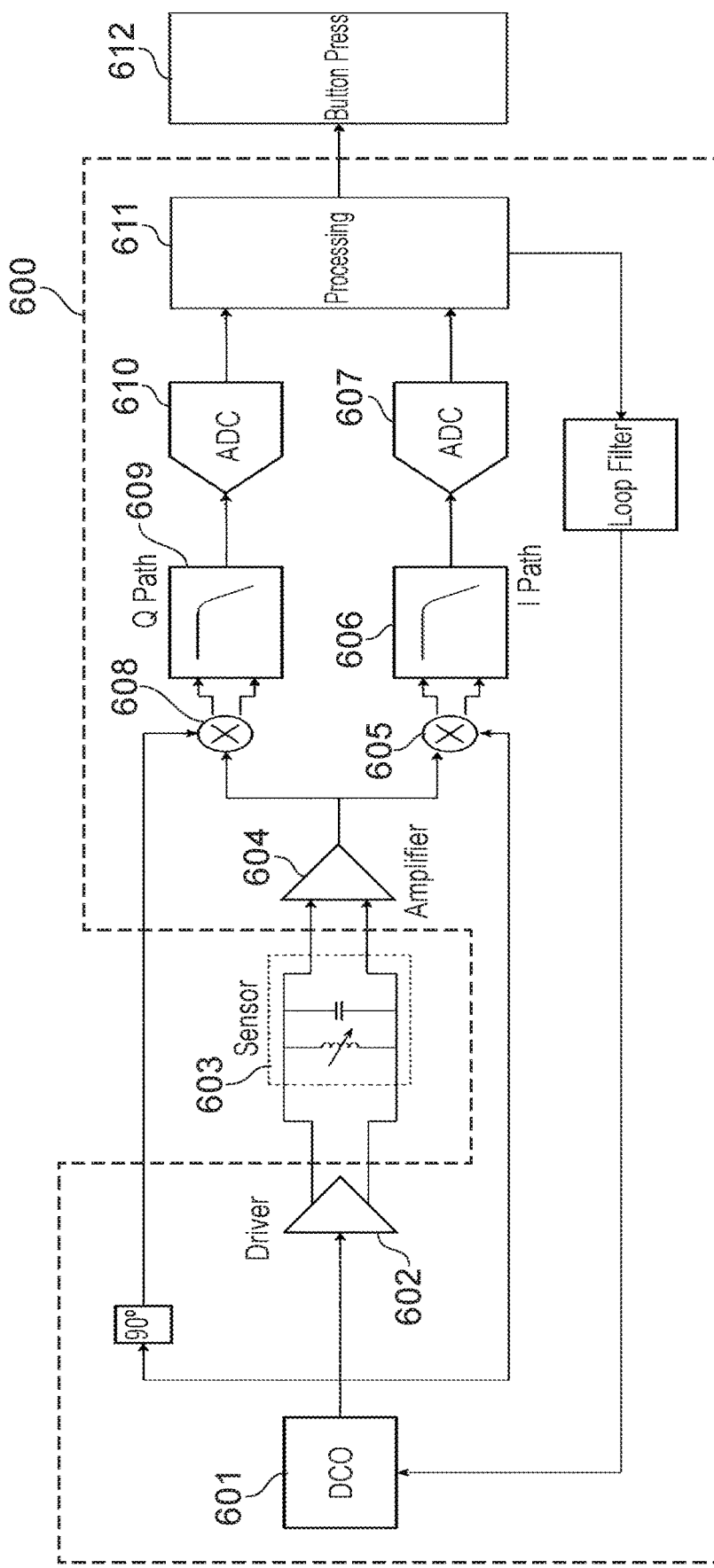
FIG. 6 illustrates an example of an inductive sensing system.

FIG. 6 illustrates an example of an inductive sensing system 600 that measures phase shift (called phase detector hereafter), which is proportional to the coil inductance. The IS AFE 502 illustrated in FIG. 5 may comprise the inductive sensing system 600 illustrated in FIG. 6.

The inductive sensing system 600 may be coupled to a sensor (Sensor) 603, wherein the sensor 603 comprises a resistive-inductive-capacitive (R-L-C) circuit. (This may be equivalent to the inductive sensor 501 illustrated in FIG. 5).

The inductance in the R-L-C circuit may comprise a coil and a metal plate,

The voltage across the sensor 603 may be generated based on the R-L-C circuit response to the current driven into the sensor 603.

Note—the resistive component R of the sensor 603 is not illustrated in FIG. 6 but will be understood as being present as an intentional or parasitic circuit component.

In this example, the inductive sensing system 600 comprises the following:

(1) A digitally controlled oscillator (DCO) 601 wherein:
The DCO 601 outputs a clock at a carrier frequency (Fc), referred to as the 0 degree output; and
The DCO 601 outputs a second square wave clock that is notionally 90 degrees shifted relative to the primary output, referred to as the 90 degree output.

(2) A drive circuit (Driver) 602 wherein:
The output of the DCO 601 is coupled to the input of the driver 602;
The drive circuit 602 drives a pseudo-sinusoidal current at the frequency and phase alignment of the 0 degree clock input; and
The drive circuit 602 drives a fixed amplitude current.
It will be understood that the driver 602 may drive a constant current at a drive frequency of 0 Hz.

(3) A I-Q receive path that receives the voltage across the sensor comprising
A low noise input amplifier (Amplifier) 604;
An I Path coupled to the output of the amplifier comprising:
An analog multiplier 605 with inputs coupled to:
the DCO 601 output that is phase aligned to the current transmitted by the driver circuit, and
the output of the amplifier 604;
A low-pass filter 606 coupled to the output of the analog multiplier 605; and
An ADC 607 coupled to the output of the low pass filter to digitize the I path voltage signal.
A Q Path coupled to the output of the amplifier 604 comprising:
An analog multiplier 608 with inputs coupled to:
the DCO 601 output that is phase offset by 90 degrees to the signal transmitted by the driver circuit, and
the output of the amplifier 604;
A low-pass filter 609 coupled to the output of the analog multiplier 608; and
An ADC 610 coupled to the output of the low pass filter 609 to digitize the Q path voltage signal.

(4) A processing block (POST PROCESSING) 611 that generates amplitude and phase information from the I-Q paths wherein:
The I Path ADC 607 output is coupled as an input into the processing block; and
The Q Path ADC 610 output is coupled as an input into the processing block.

The DSP 505 may then comprise a button press detection block 612 that observes the phase information to determine if the shift in phase recorded by the I-Q detection path is interpreted as a button press.

In this example inductive sensing system 600, to perform one scan of the R-L-C sensor 603 the following may be performed:

The DCO 601 and drive current 602 are activated.
After the low pass filter(s) 609, 606 have settled, the ADC(s) 610, 607 are activated and one or multiple ADC samples are captured at a capture frequency, preferably at approximately 500 kHz.
The duration over which the ADC samples are captured is referred to as the conversion time.
Each ADC sample contains a certain amount of noise due to analog and digital factors including, but not limited to:
Circuit thermal noise
Circuit flicker noise
Digital quantization noise
One or multiple ADC samples are filtered to attenuate noise.
Processing converts the I and Q signals into phase and amplitude information.

It will be appreciated that, whilst the filtering in FIG. 6 is illustrated as occurring on the ADCs 610, 607 outputs, the filtering may occur at multiple different places in the processing path. In addition, it will be understood that a voltage-controlled oscillator (VCO) may be used instead of a DCO 601 for the above-described system.

The power in the inductive sensing system 600 may vary based on a number of factors, for example:
Scan rate: if more scans are performed within a certain measure of time, the power will increase compared to less scans performed.
Conversion time: longer conversion times require the circuits to be active for a longer time, increasing power consumption.

Returning to FIG. 5, the output of the inductive sensing system $V_{SENSE}$ may be used by the DSP 505 to trigger the haptic amplifier 503, which may playback any one of the stored haptic representations in the memory 506 to the haptic module 504 based on the type of tactile feedback needed. The haptic amplifier 503 may be implemented as a Class-D system and as such, may have significant out of band content (e.g. outside of the 0-20 Khz band that is used to transmit the signal) going up to several tens of megahertz.

One example of a haptic amplifier output is a Pulse Width Modulated (PWM) stream that, in addition to the signal power being located in 0-20 Khz band, has harmonics and out of band noise up to 50 Mhz or above.

In such a system, the haptic amplifier output may have noise or tonal content in the same operating frequency range as the inductive sensor itself (i.e. within the range of the carrier frequency Fc). This may add noise to the inductive sense phase calculations, affecting accuracy, functionality or both.

To address this, the HMI system 500 may be configured as follows.

The sensor 501 described in the system may be comprised of a resistive-inductive-capacitive (R-L-C) circuit, whose inductive component is comprised of a metal coil, which is nominally an antenna, and as such is capable of detecting electromagnetic fields external to the system.

In examples in which the IS AFE 502 comprises the inductive sensing system 600 as described in FIG. 6, the inductive sensing sub-system 600 comprises the I-Q Receive Path, which is comprised of analog mixers and low-pass filters. Once the Analog-Digital Conversion is complete, there may also be digital filtering applied to the signals. There is a frequency band-of-interest for the input signal that the inductive sensing sub-system is trying to detect, and thus the I-Q Receive Path may be designed to intrinsically reject signals outside this band. The amount of rejection varies with the frequency of the signal applied and how close it is to the band-of-interest (a band around a carrier frequency Fc). External interference that lies within this band may degrade the signal-to-noise ratio and lead to reduced accuracy of the inductive sensing sub-system.

In a system co-habited by both an input sensor system (such as inductive sensing system 600) and a vibrational output system (such as a haptic amplifier and a haptic module), a portion of the noise or distortion produced by the vibrational output system may fall directly within the band-of-interest (BWc) of the input sensor system (or in the close neighborhood of BWc), and may degrade the phase or amplitude measurement accuracy.

Figure 7:
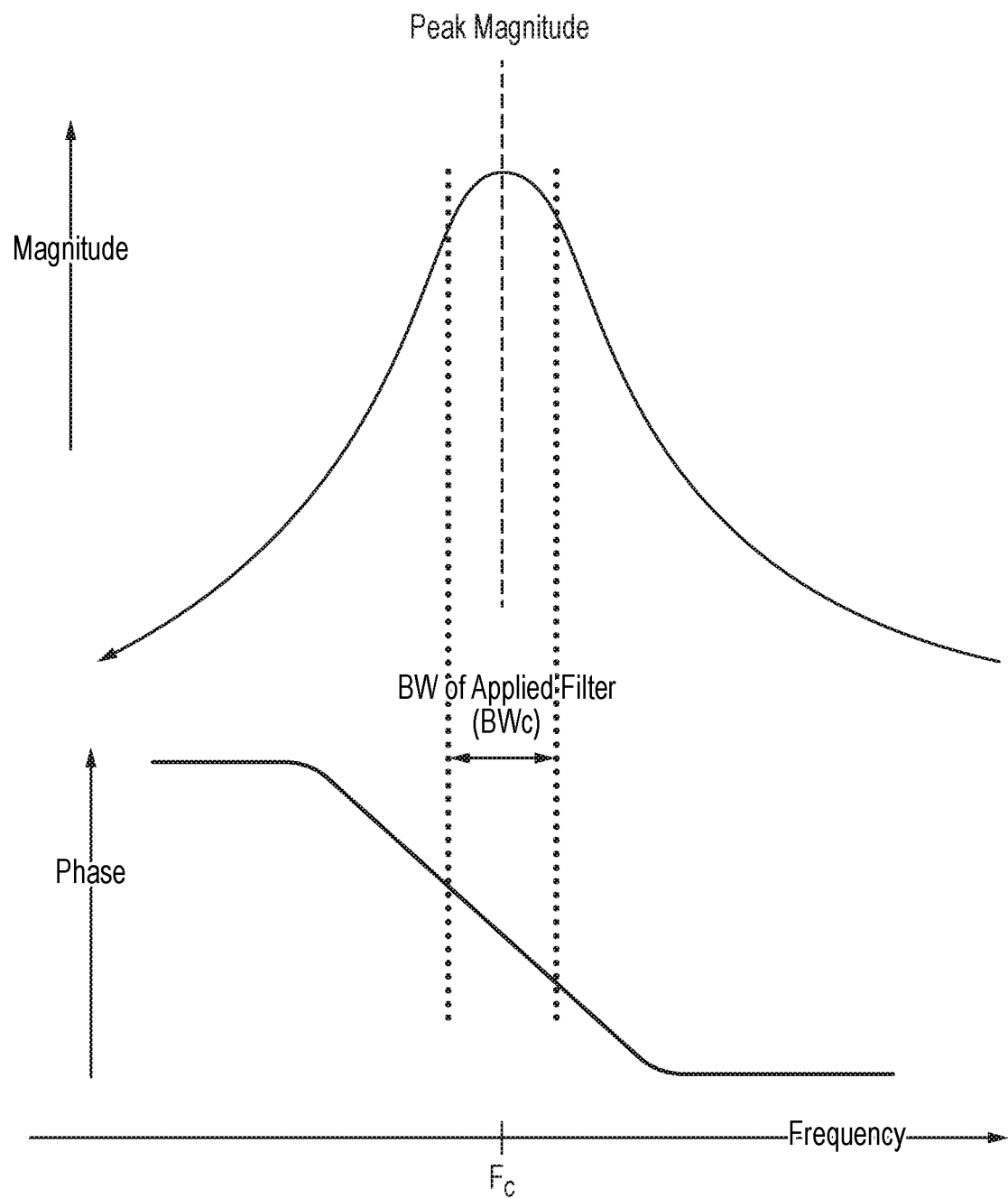
FIG. 7 illustrates the band-of-interest BWc for an inductive sensing sub-system.

FIG. 7 illustrates the band-of-interest BWc for an inductive sensing sub-system.

It will be appreciated that the output energy of the vibrational output system may couple to the input sensor system cause inaccuracies—especially when the output energy is close to the carrier frequency Fc of the input sensor system. Coupling mechanisms may include, but are not limited to electrical coupling, mechanical coupling or vibrational coupling. IT will also be appreciated that the output energy of the vibrational output system may result in some thermal effects. For example, if the input sensor system is dependent on temperature, or the output of the input sensor system varies in some way with temperature, then the vibrational output system may couple with the input sensor system by heating up the input sensor system whilst the vibrational output system is active.

One example of electrical coupling may occur when a trace or parasitic capacitance exists between for example a haptic amplifier output of the vibrational output system and a sensor input (or output) of the input sensor system. The out-of-band for example, PWM content output by the vibrational output system may couple onto the sensor signal path as an external interferer. Other coupling mechanisms may include power-supply coupling, inductive or electromagnetic coupling, or IC substrate coupling.

Figure 8:
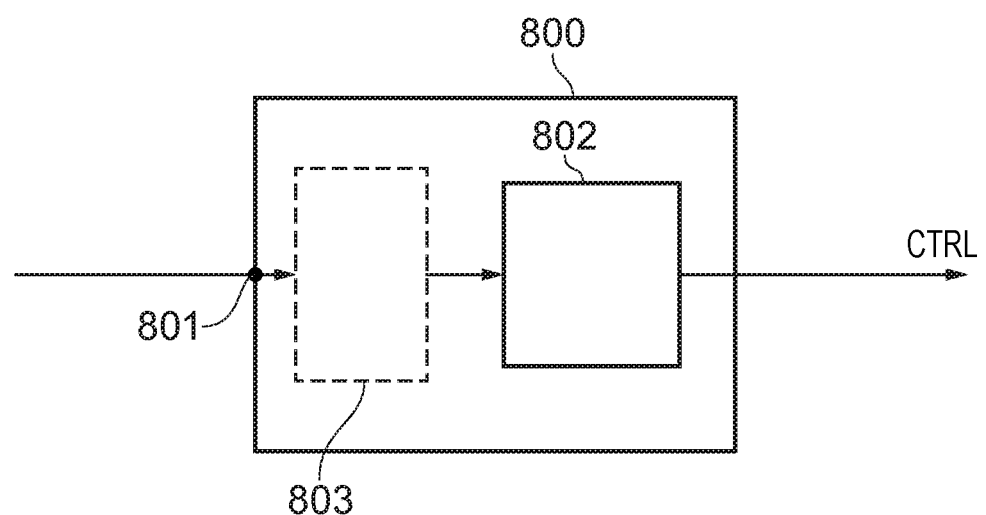
FIG. 8 illustrates a controller for controlling operation of a vibrational output system and/or operation of an input sensor system according to some embodiments.

FIG. 8 illustrates a controller 800 for controlling operation of a vibrational output system and/or operation of an input sensor system according to some embodiments. The controller is for use in a device comprising the vibrational output system and the input sensor system. For example, the device may comprise the device 101 illustrated in FIG. 1, and the integrated haptic system 112 illustrated in FIG. 1 (or 112A illustrated in FIG. 2) may comprise a controller 800 as illustrated in FIG. 8. In particular, the DSP 202 of FIG. 2, or DSP 505 of FIG. 5 may comprise a controller 800 as described with reference to FIG. 8.

The controller 800 comprises an input 801 configured to receive an indication of activation or de-activation of an output of the vibrational output system. For example, the indication may comprise the signal $V_{SENSE}$ from a force sensor 105 as illustrated in FIG. 2. The signal $V_{SENSE}$ may indicate activation of an output of the vibrational output system when the signal $V_{SENSE}$ indicates that a force is sensed at the force sensor 105 as the controller may be configured, as described above, to output a vibrational output signal to the vibrational output system in response to the signal $V_{SENSE}$ indicating that a force has been sensed at the force sensor.

In some embodiments, the indication may comprise the haptic playback signal $V_{IN}$. In these examples, a delay may be applied to the haptic playback signal $V_{IN}$ before outputting the signal to the haptic module in order to account for any delay in processing provided by the controller 800. The haptic playback signal $V_{IN}$ may indicate activation of an output of the vibrational output system, for example, when the haptic playback signal is non-zero or has an amplitude above a predetermined threshold.

The controller 800 further comprises an adjustment module 802 configured to adjust the operation of the vibrational output system and/or the operation of the input sensor system based on the indication to reduce an interference expected to be caused by the output of the vibrational output system on the input sensory system. For example, the controller 800 may be configured to output a control signal CTRL to one or both the vibrational output system and the input sensor system.

In some examples, the indication may be processed by a processing block 803 before input into the adjustment module 802. For example, where the indication comprises the signal $V_{SENSE}$ the controller may comprise a button press detection block 803, for example, the button press detection block 612 as illustrated in FIG. 6. The button press detection block 612 may then output an indication to the adjustment module indicating whether or not the signal $V_{SENSE}$ is indicative of a button press. However, in some examples, the button press detection block may form part of the input sensor system, and the controller 800 may receive the indication of whether or not the signal $V_{SENSE}$ is indicative of a button press.

It will be appreciated that the processing block 803 perform different processing depending on the nature of the input sensor system. For example, if the input sensor system comprises a camera sensor system, the processing block 803 may be configured to determine whether or not the camera is being used.

Given an input sensor system and a vibrational output system, one or more of the following approaches may be used to ensure optimal efficiency and co-design with zero or minimal loss of sensitivity, accuracy and functionality. It will be understood that the described approaches may be implemented by a controller 800 provided as part of the input sensor system and/or as part of the integrated haptic system or smart haptic amplifier as described above.

For example, the input sensor system 902 may comprise an inductive sensing system 600 as illustrated in FIG. 6. The inductive sensing system 600 may have several programmable/variable parameters that may be adjusted by the adjustment module 802 in response to the indication. For example, the filtering applied by the inductive sensing, for example, the time and bandwidth used in either the analog filtering or digital filtering (post-ADC) may be variable. The higher the time (and lower the BW), the narrower the BWc produced. The drive amplitude of the inductive sensing system 600 may also be adjusted. For example, the amplitude of the signal driven to the sensor 603 may be variable. By varying the drive signal to the sensor 603, the adjustment module 802 may vary the SNR by varying the "signal" portion of SNR. These examples (and others) will be described in more detail below with reference to FIG. 9.

Figure 9:
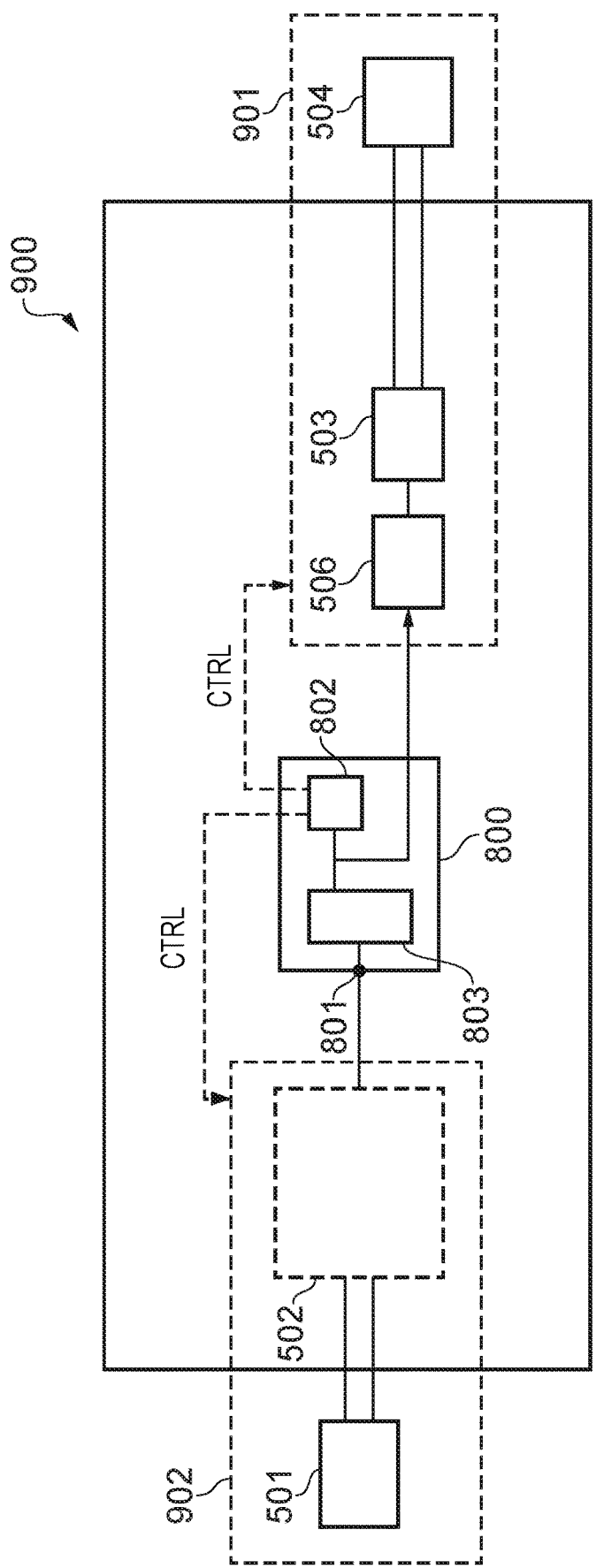
FIG. 9 illustrates a controller in an HMI system according to some embodiments.

FIG. 9 illustrates the controller 800 in an HMI system 900. The HMI system 900 may form part of a device. The HMI system 900 comprises a vibrational output system 901, an input sensor system 902 and controller 800.

The vibrational output system 901 may also comprise any suitable vibrational output system for example a haptic output system or a surface audio output system.

In this example, the vibrational output system 901 comprises a haptic output system and the input sensor system 902 comprises a force sensor system.

The controller 800 is configured to receive the output of the inductive sensing analog front end 502. The detection block 803 may then determine whether the output of the inductive sensing AFE 502 is representative of a button press. It will be appreciated that in embodiments in which the input sensor system comprises another type of sensor (for example a camera), the detection block 803 may be configured to detect when the input sensor system is outputting a signal during which it is desirable to output a vibrational output to the user of the device.

The adjustment module 802 may then be configured to output a control signal CTRL to one or both of the vibrational output system 901 and the input sensor system 902 based on the output of the detection block 803.

For example, the adjustment module 802 may be configured to increase a drive amplitude or a power level of the input sensor system 902 responsive to the indication indicating activation of the output of the vibrational output system 901. Since the output of the inductive sensing AFE 502 may be used to determine if the haptic amplifier needs to be activated, the drive amplitude (or power level) to the input sensor 501 may be temporarily increased for the duration that the vibrational output system is active. In this way, the total signal to noise ratio (SNR) of the signal output by the input sensor 501 may still meet a minimum threshold. In other words, whilst the noise or interference caused by the vibrational output system may remain the same as if there were no adjustment made by the adjustment module 802, the amplitude of the sensor signal is increased to compensate.

For example, referring to FIG. 6, the adjustment module 802 may be configured to control the drive circuit 602 so that the drive amplitude to the sensor is increased responsive to the indication indicating activation of the output of the vibrational output system 901.

In some examples, the adjustment module 802 is configured to adjust a bandwidth or conversion time associated with operation of the input sensor system responsive to the indication indicating activation of the output of the vibrational output system.

For example, the bandwidth associated with operation of the input sensor system may comprise a filtering bandwidth applied to an output signal of the input sensor system, and wherein the adjustment module is configured to reduce the filtering bandwidth responsive to the indication indicating activation of the output of the vibrational output system. For example, the adjustment module 802 may be configured to adjust the filtering bandwidth applied by the filters 609 and/or 606 in the inductive sensing system 502.

For example, the filtering bandwidth (BW) or conversion time in the inductive sensing AFE 502 may be adapted when the haptic amplifier is activated. For example, the filtering BW may be adjusted by the adjustment module 802 to be much narrower around the carrier frequency $F_c$. By narrowing the filtering bandwidth, a higher proportion of the interfering vibrational output signal may be filtered out of the signal $V_{SENSE}$ thereby reducing the interference expected to be caused by the output of the vibrational output system on the input sensory system.

The adjustment of the filtering bandwidth or conversion time may be further optimized by calibration. The calibration maybe performed either at a stage of initial manufacture or assembly of a device, or in real-time. To perform the calibration, a zero signal may be driven into the input sensor 501 while the vibrational output system 901 is activated, and the output of the inductive sensing AFE 502 (e.g. the phase and/or amplitude) may be measured. In this way, only the interference caused by the vibrational output signal is being measured from the output of the inductive sensing AFE 502.

To calibrate the system, the filtering bandwidth of the inductive sensing AFE 502 and/or the conversion time of the inductive sensing AFE 502 may be changed (for example iteratively) until the output of the inductive sensing AFE 502 falls below a pre-determined noise threshold. The filtering BW and/or conversion time settings that cause the output of the inductive sensing AFE 502 to fall below the pre-determined noise threshold may be then stored in on-device or local memory.

The adjustment module 802 may then, (for example, during normal operation of the device), be configured to obtain a bandwidth or conversion time setting from a memory; and apply the bandwidth or conversion time setting to the input sensor system 902 whilst the indication indicates activation of the output of the vibrational output system. In other words, during normal operation of the system (e.g. where the signal driven into the input sensor 501 may be non-zero) when the vibrational output system is activated (or to be activated), the stored filtering BW and/or conversion time settings may be retrieved from the memory and applied to the inductive sensing AFE 502 such that the output of the inductive sensing AFE 502 is effectively set as noise.

Once the indication indicates that the vibrational output system 901 is no longer active, the inductive sensing AFE 502 may be returned to the original filtering and/or conversion time settings for regular sensor operation.

In some examples, the adjustment module may be configured to apply digital post-compensation. In this example, the system may be calibrated. The calibration maybe performed either at the stage of initial manufacture or assembly, or in real-time. To perform the calibration, a zero signal may be driven into the input sensor 501, while the vibrational output system 901 is activated and the output of the inductive sensing AFE 502 (e.g. the phase and/or amplitude) may be measured.

For example, as a particular output signal is output through the vibrational output system 901, the controller 800 may measure the output of the inductive sensing AFE 502. A compensation waveform may then be determined for the particular output signal, wherein the compensation waveform is the inverse of the output of the inductive sensing AFE 502 during output of the output signal through the vibrational output system 901. Compensation signals may be determined for a number of predetermined output signals (e.g. haptic playback signals) expected to be output through the vibrational output system during normal operation of the device. Each compensation signal may be stored associated with the respective associated output signal.

The adjustment module 802 may then be configured to: responsive to the indication indicating activation of the output of the vibrational output system, obtain a compensation signal from a memory comprising one or more stored compensation signals, wherein the compensation signal is associated with an output signal for output by the vibrational output system; and apply the compensation signal to a sensor signal (e.g. $V_{SENSE}$) output by the input sensor system whilst the output signal is output by the vibrational output system. For example, the adjustment module 802 may be configured to add the compensation signal to the output of the inductive sensing AFE 502. By applying the compensation signal to the sensor signal output by the inductive sensing AFE 502 during output of the associated output signal, the expected interference of the output signal on the input sensor system 902 may be cancelled out. In this example, the compensation waveform may be applied to the sensor signal before the controller 800 processes the output of the inductive sensing AFE 502 to determine whether or not, for example, a button press has occurred at the input sensor system 902.

When the indication indicates that the vibrational output system 901 is no longer active, the adjustment module 802 may be configured to no longer apply the compensation signal to the sensor signal.

In some examples, the operating frequency of the input sensor system 902 may be adjusted when the vibrational output system 901 is activated. For example, responsive to the indication indicating activation of the output of the vibrational output system, the adjustment module 802 may be configured to select an operating frequency (for example, the carrier frequency $F_c$) of the input sensor system based on an output signal being output by the vibrational output system.

Considering an example in which the vibrational output system 901 comprises a haptic output system. If a harmonic tone of the haptic amplifier 503 is falling at or close to the operating frequency or carrier frequency Fc of the input sensor system 902 such that it cannot be filtered effectively by the inductive sensing AFE 502, The carrier frequency (or operating frequency) Fc may be adjusted such that the harmonic tone may now be filtered. As the carrier frequency Fc may be generally of the order of tens of MHz, changing Fc in the order of 100 Khz does not materially change the sensitivity of the input sensor system 902, but may allow for filtering of the interference caused by the harmonic tone as the harmonic tone may be forced out of the filtering bandwidth applied by the inductive sensing AFE 502. Therefore, the adjustment module 802 may be configured to select the operating frequency of the input sensor system 902 such that the output signal output by the vibrational output system 901, or harmonic tones produced during output of the output signal, do not lie within the filtering bandwidth of the input sensor system 902.

In some examples, a similar effect may be implemented using a keep-out zone provided with either factory or real-time calibration. For example, a zero signal may be driven into the input sensor system 902 and the vibrational output system 901 may be activated. The output of the input sensor system 902 may then be measured during activation of the vibrational output system 901. In this way, only the interference caused by the activation of the vibrational output system 901 is being measured. During measurement of the interference, the operating frequency (Fc) of the input sensor system 902 may be swept through a range of frequencies, and instances in which the IS AFE 502 output (phase and/or amplitude) falls above a pre-determined noise and/or accuracy threshold are recorded. The frequency values associated with these instances may then be stored and keep-out zones may be determined that comprise these frequency values. In this example, when the vibrational output system 901 is activated (or to be activated), the carrier frequency Fc may be selected by the adjustment module 802 such that it does not fall in any of the keep-out zones. For example, the adjustment module 802 may be configured to responsive to the information indicating activation of the output of the vibrational output system, select an operating frequency (e.g. carrier frequency $F_c$) of the input sensor system such that the operating frequency does not lie within a predefined keep-out zone.

Once the vibrational output system 901 is no longer activated, the original settings can be resumed with no keep-out zones applied to the operating frequency of the input sensor system 902.

In some examples, the adjustment module is configured to blank out the output signal of the input sensor system 902, for example, by setting the output of the input sensor system 902 to zero, or otherwise cause the HMI system 900 to ignore the output of the input sensor system 902 when the vibrational output system 901 is activated. For example, the adjustment module 802 may be configured to blank out an output signal of the input sensor system responsive to the indication indicating activation of the output of the vibrational output system. For example, the adjustment module may be configured to either power down the IS AFE 502 or put the IS AFE 502 in standby, or the adjustment module may be configured to cause the controller 800 to simply ignore the data during activation of the vibrational output system 901.

For example, the adjustment module 802 may be configured to blank out the output signal by one or more of: placing the input sensor system 902 in a low power mode, putting the input sensor system 902 in an inactive mode, or ignoring the output signal of the input sensor system 902 whilst the indication indicates activation of the output of the vibrational output system.

In some examples, the adjustment module 802 is configured to, responsive to the indication indicating activation of the output of vibrational output system 901, adjust the operation of the input sensor system 902 such that the input sensor system 902 performs sensing only during one or more time intervals during which an output signal being output to the vibrational output system has a vibrational amplitude below a predetermined threshold amplitude. For example, the output signal to be output to the vibrational output system 901 may be designed such that there are small time intervals (or quiet periods) in the vibrating pattern of the tactile feedback in which the amplitude of the output signal is below a predetermined threshold. In other words, during these time intervals any interference caused by the vibrational output system on the input sensor system will be reduced due to the lower amplitude of the output signal. The input sensing system 902 may therefore perform sensing during these time intervals when no or reduced interference associated with the vibrational output system 901 is present. This embodiment may also ensure that no input data is lost (for example, no button press is missed at the input sensing system 902) as may be the case in prolonged blanking intervals. In some examples, the adjustment module 802 may be configured to adjust the operation of the input sensor system 902 by causing the controller 800 (or the button press detection block 803) to ignore the sensing signal $V_{SENSE}$ outside of the time intervals. Alternatively, the input sensing system 902 may be deactivated by the adjustment module 802 during the time intervals.

In some examples, the adjustment module 802 is configured to, responsive to the indication indicating activation of the output of vibrational output system, trigger a desensitization window to apply to an output of the input sensor system. For example, when the vibrational output system 901 is activated, for example where an output signal causing vibration is output by the vibrational output system, the adjustment module 802 may be configured to trigger a desensitisation window such that the output of the input sensor system 902 is desensitised in order to compensate for the possible interference caused by the activation of the vibrational output system 901. The adjustment module 802 may be configured to trigger the desensitization window by adjusting operation of the input sensor system 902 for example, by adjusting a threshold used by the input system 902 to detect an event so as to reduce the sensitivity of the input sensor system 902 to such events. In this example therefore the input sensor system 902 may be considered to comprise the button press detection block 803. The adjustment module 800 may then be configured to increase a threshold employed by the button press detection block 803 to determine if a force indicated by the output of the IS AFE 502 is indicative of a button press. By increasing this threshold, the adjustment module reduces the sensitivity of the button press detection block 803 to button press events.

In some examples, the adjustment module may be configured to trigger the desensitization window by applying a negative gain to the output of a sensor 501, or to the output of the input sensor system 902. This may be considered analogous to increasing the threshold at which the button press detection block 803 will detect a button press event as by reducing the gain of the signal.

By effectively reducing the sensitivity of the input sensor system 902 during the desensitization window, the adjustment module 802 may mitigate the impact of the activated vibrational output system 901 on the input sensor system 902, or on any other systems relying on the output of the input sensor system 902. In some examples the desensitization window may have a variable duration, which for example could be based on the duration of the vibration output signal and/or the possibility of post-vibration-output "ringing". In addition, a factor by adjustment module reduces the gain of the output of the input sensor system 902 or increases the threshold applied by the button press detection block 803 may be configured based on the amplitude of the output of the vibrational output system 901. As a further aspect, it will be understood that the desensitization window may be split, for example, the factor may vary during the duration of the desensitization window.

It will be understood that some of the above-described functions of the adjustment module 802 may not be suitable for use with all types of input sensor system 902. For example, if the adjustment module is configured to blank out the output signal of the input sensor system, this may result in noticeable drop-outs or distortions if the input sensor system comprises a microphone sensor system (e.g. during a voice call), or the input sensory system comprises a gyroscope or accelerometer sensor system (e.g. when motion of the device is being used as an input to e.g. a gaming application). In examples such as these (or with suitable input sensor system), the adjustment module 802 may be configured as illustrated in FIG. 10.

Figure 10:
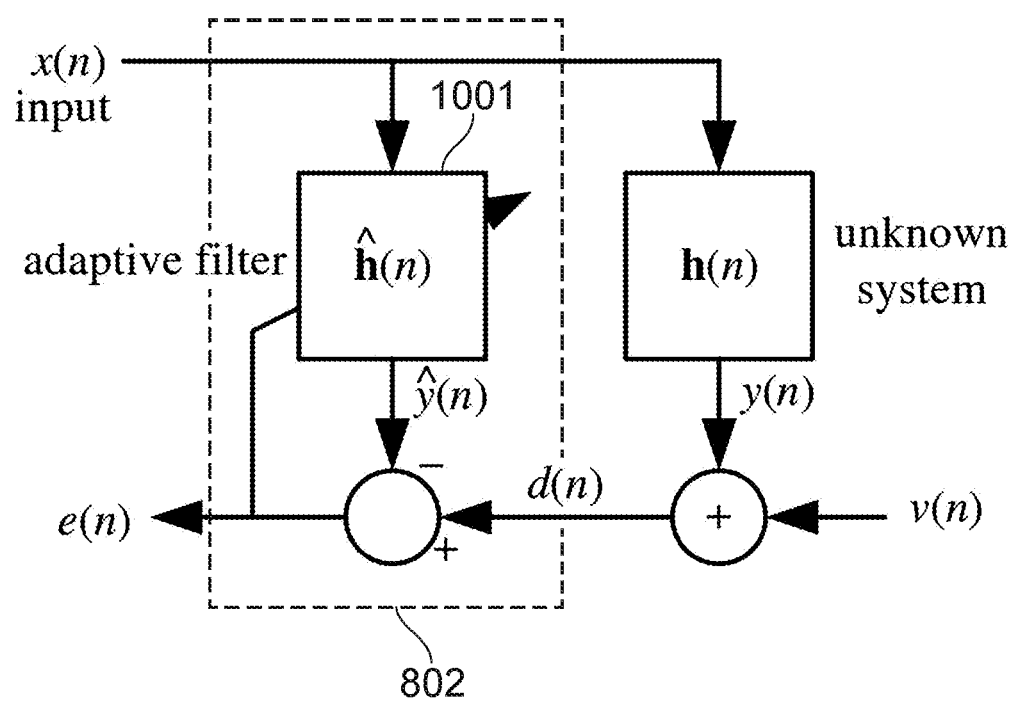
FIG. 10 illustrates an example of an adjustment module according to some embodiments.

FIG. 10 illustrates an example of an adjustment module 802 according to some embodiments.

In this embodiment, the adjustment module 802 may be configured to predict the output effect of the vibrational output system 901 on the input sensor system 902, and to determine the nature of any filtering that may be performed to mitigate the effect of the vibrational output signal on the input sensor system 902.

In particular, it may be possible to model the vibrational output system 901, the mechanical surroundings of the device, and the input sensor system 902. For example, it may be possible to regard the collective parts listed above as linear systems which may be modelled by an adaptive filter.

In this embodiment therefore, the adjustment module 802 comprises an adaptive filter 1001.

In FIG. 10, the transfer function h(n) represents the real transfer function of the unknown system comprising the vibrational output system 901, the mechanical surroundings of the device, and input sensor system 902. For example, h(n) may represent the coupling effect between the vibrational output system and the device frame, input sensor system (and any other mechanical factors) on the vibrational output system.

The signal x(n) comprises the vibrational output signal. The signal y(n) then represents the vibrational output signal following coupling with the input sensor system and any other mechanical factors of the device.

The signal v(n) represents the desired input sensor signal received at the input sensor system, in other words the signal that would be received at the controller if the transfer function h(n) had no effect on the input sensor system. The signal d(n) then represents the signal actually output by the input sensor system that is affected by the vibrational output system and other mechanical effects of the device according to h(n). The signal d(n) may be received by the adaptive filter 1001.

The model hˆ(n) of the adaptive filter 1001 (which may be a model in the electrical domain) replicates the actual transfer function h(n). The model hˆ(n) may then be continuously adapted to track changes in the actual system. The adaptation of the model hˆ(n) may be performed when there is no input sensor signal v(n) and/or the adaption rate may be at different rate to the signal v(n) (for example, if v(n) is a fast signal hˆ(n) may adapt slowly). The signal yˆ(n) may therefore be representative of the signal y(n) such that when the model hˆ(n) matches the actual transfer function h(n) the signal e(n) is equivalent to the input sensor signal v(n).

The adaptive filter may comprise a linear filter, such as a Finite Impulse Response (FIR) or an Infinite Impulse Response (IIR) filter, which may be updated using appropriate adaptive filtering methods such as recursive Least Mean Squares (LMS), Kalman filters, etc.

In some examples, the output e(n) may be limited when the interference is too high or the filter hˆ(n) fails to track the real transfer function h(n). This may be referred to as a non-linear canceller.

In some examples, the input sensor system and/or vibrational output system may be preconfigured for operation in conjunction with each other.

For example, a controller (for example controller 800) may be provided for outputting an output signal to the vibrational output system for use in a device comprising the vibrational output system and an input sensor system. The controller may comprise an input for receiving an input signal; and a filter for filtering the input signal to provide the output signal; wherein the filter is configured to filter the input signal based on an operating or carrier frequency associated with the input sensor system. In other words, the controller may be preconfigured with the operating of carrier frequency of the input sensor system such that the output signal output by the vibrational output system is filtered by the input sensor system and therefore the interference caused by the vibrational output system may be reduced or avoided.

In some examples, the filter may comprise one or more filter poles (or notches) such that attenuation is provided in a narrow band based on where the pole is located in the frequency domain. In some examples, the one or more filter poles or notches may be programmable. For example, the controller 800 may comprise an input configured to receive an indication of the operating or carrier frequency of the input sensor system, and the adjustment module 802 may be configured to dynamically adjust the filtering of the filter based on the indication of the operating or carrier frequency of the input sensor system. In this way, if, for operational reasons, the carrier frequency Fc (or operating frequency) of the input sensor system is changed dynamically or upon reset, then the notch or pole may also be changed appropriately.

One example of implementing the filter may be to implement a Finite Infinite Response (FIR) filter in one of the stages of the vibrational output system. With proper placement, the notch (or pole) may contribute to attenuating the output signal of the vibrational output system as well as any noise or harmonics of the output signal that fall in the same frequency band as the input sensor system operating frequency.

In some examples, a controller (for example controller 800) may be provided for outputting an output signal to a vibrational output system for use in a device comprising the vibrational output system and an input sensor system. The controller may comprise a processing block configured to output the output signal, wherein the processing block is configured such that integer harmonic tones of the output signal fall outside a frequency band associated with operation of the input sensor system. The processing block may comprise an output pulse width modulation, PWM, amplifier. For example, once the set of sensor operating frequencies (Fc) is known, the fundamental PWM frequency of the haptic amplifier may be selected such that none of its integer harmonic tones fall within a predetermined band of Fc.

In some examples, the controller 800 may comprise an input configured to receive an indication of the frequency band associated with operation of the input sensor system. The adjustment module 802 may then be configured to dynamically adjust the operation of the processing block based on the received indication such that integer harmonic tones of the output signal fall outside the frequency band associated with operation of the input sensor system. In some examples the controller may be configured to vary the edge rate of the PWM waveform to change its harmonic content such that the harmonic tones of the output signal fall outside the frequency band associated with operation of the input sensor system.

Figure 11:
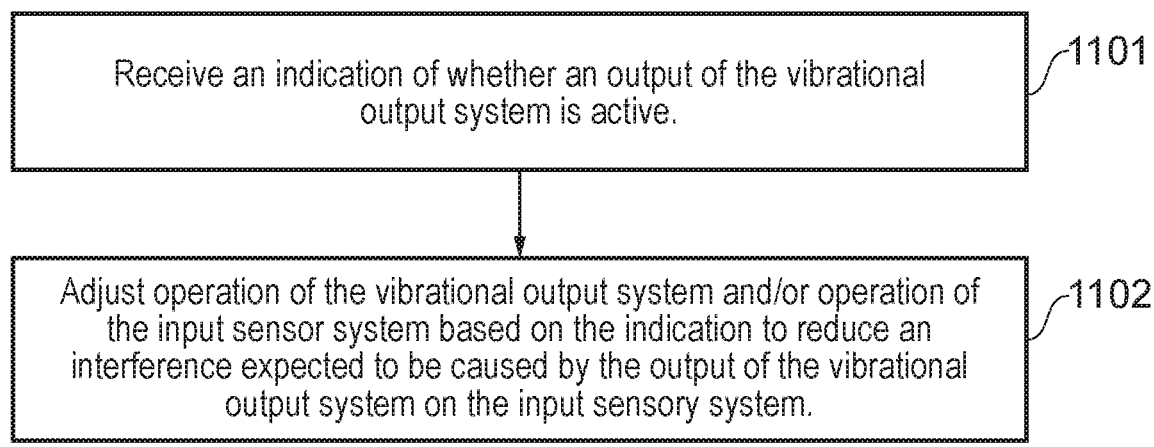
FIG. 11 illustrates a method for use in a device comprising a vibrational output system and an input sensor system for controlling operation of the vibrational output system and/or the input sensor system according to some embodiments.

FIG. 11 illustrates a method for use in a device comprising a vibrational output system and an input sensor system for controlling operation of the vibrational output system and/or the input sensor system. The method may be performed by a controller (for example controller 800 as illustrated in FIGS. 8, 9 and 10). In some examples, the method may be implemented by a DSP, such as DSP 202 illustrated in FIG. 2 or DSP 505 of FIG. 5.

In step 1101 the method comprises receiving an indication of whether an output of the vibrational output system is active. For example, the indication may comprise the signal $V_{SENSE}$ from a force sensor 105 as illustrated in FIG. 2. The signal $V_{SENSE}$ may indicate activation of the output of the vibrational output system when the signal $V_{SENSE}$ indicates that a force is sensed at the force sensor 105 as the controller may be configured, as described above, to output a vibrational output signal to the vibrational output system in response to the signal $V_{SENSE}$ indicating that a force has been sensed at the force sensor.

In some embodiments, the indication may comprise the haptic playback signal $V_{IN}$. In these examples, a delay may be applied to the haptic playback signal $V_{IN}$ before outputting the signal to the haptic module in order to account for any delay in processing provided by the controller 800. The haptic playback signal $V_{IN}$ may indicate activation of an output of the vibrational output system, for example, when the haptic playback signal is non-zero or has an amplitude above a predetermined threshold.

In step 1102, the method comprises adjusting operation of the vibrational output system and/or operation of the input sensor system based on the indication to reduce an interference expected to be caused by the output of the vibrational output system on the input sensory system. For example, as described with reference to FIGS. 8 and 9, the step 1102 may comprise any of the functional operations described as being performed by the adjustment module 802. It will however be appreciated that the functional operations may be performed by different functional blocks.

It will be understood that the above approaches described for an inductive sensing system may also be used for other sensing systems as appropriate. For example, a smart haptic amplifier having a resistive force sensing front end may be configured to implement appropriate sensor compensation, blanking windows and/or adaptive haptic output as described above. Similar approaches may be used for any other suitable sensor system in a device, e.g. for the output of an accelerometer, gyroscope, etc., sensor compensation, blanking windows and/or adaptive haptic output as described above may also be used.

In a further aspect, the input sensor system may comprise a camera or other type of optical sensor, wherein the controller 800 is arranged to control the camera or optical sensor itself, and/or is arranged to perform compensation on the output of the camera or optical sensor, to reduce the effect of haptic or other vibrational output signals on the sensor system. The controller 800 may perform image stabilization based at least in part on the vibrational output.

It will be understood that the above-described system and methods may also be used for the reduction or elimination of crosstalk from surface audio-based systems, where at least one actuator is used to drive oscillation or vibration of a surface of a device, e.g. a screen or case of a mobile phone, to produce acoustic output. As such systems utilize mechanical vibrations of a portion of the device to produce device audio, the vibrations may interact with existing input sensors or transducers similar to the haptic crosstalk as described above. In such cases, it will be understood that a surface audio amplifier may be used in place of the haptic amplifier as described above.

It will be understood that the above-described methods may be implemented in a dedicated control module, for example a processing module or DSP as shown in the above figures. The control module may be provided as an integral part of the sensor system or may be provided as part of a centralized controller such as a central processing unit (CPU) or applications processor (AP). It will be understood that the control module may be provided with a suitable memory storage module for storing measured and calculated data for use in the described processes.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term "module" or the term "block" shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone. There is further provided a host device incorporating the above-described system.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

Aspects of the system may be defined by the following numbered statements:

1. A device comprising:
   an input sensor system;
   a vibrational output system driven to provide vibrational output;
   a controller arranged to monitor the vibrational output system and to adjust the operation of the vibrational output system and/or the operation of the input sensor system to minimize the effect of the vibrational output on the input sensor system.

2. Preferably, the vibrational output system comprises a haptic output system arranged to provide a haptic vibrational output. Additionally or alternatively, the vibrational output system comprises a surface audio output system.

3. Preferably, the input sensor system comprises a force sensing system.

4. Preferably, the force sensing system comprises at least one force sensor selected from one or more of the following:
   capacitive displacement sensors,
   inductive force sensors,
   strain gauges,
   piezoelectric force sensors,
   force sensing resistors,
   piezoresistive force sensors,
   thin film force sensors, and
   quantum tunneling composite-based force sensors.

5. Additionally or alternatively, the input sensor system comprises at least one of the following: an accelerometer, a gyroscope, a microphone transducer, a camera, an optical sensor, an ultrasonic sensor.

6. In one aspect, the controller adjusts the vibrational output system such that the transfer function of the vibrational output system comprises a notch or pole approximately at an operating frequency of the input sensor system.

7. Preferably, the controller is configured to dynamically adjust the vibrational output system such that the presence of a notch or pole in the transfer function of the vibrational output system is updated if the characteristics of the vibrational output system and/or of the input sensor system change.

8. In an additional or alternative aspect, the controller is configured to adjust an operating point of the input sensor system based on an output of the vibrational output system.

9. Preferably, the controller is configured to increase a power level or a drive amplitude of the input sensor system, to increase the signal to noise ratio of the input sensor system.

10. In an additional or alternative aspect, the controller is configured to adjust a bandwidth of operation of the input sensor system based on an output of the vibrational output system.

11. Preferably, the controller is arranged to adjust a filter bandwidth of the input sensor system, preferably to reduce the filter bandwidth to filter out interfering signals from the vibrational output system.

12. Additionally or alternatively, the controller is configured to adjust a conversion time of the input sensor system based on an output of the vibrational output system.

13. In a further aspect, the device comprises:
- a memory storage arranged to store a plurality of sensor system profiles defining system characteristics such as a filter bandwidth, a conversion time, a power level or a drive amplitude;
- wherein the controller is configured to select a sensor system profile to adjust the operation of the input sensor system based on the vibrational output system.

14. Preferably, the plurality of sensor system profiles define different configurations of the input sensor system selected to minimize the effect of the vibrational output on the input sensor system.

15. In an additional or alternative aspect,
- the vibrational output system comprises a haptic module configured to drive a haptic actuator with a haptic waveform,
- wherein the controller is provided with a plurality of digital compensation waveforms based on an inverted version of the effect of an individual haptic waveform on the input sensor system, and
- wherein the controller is configured to apply an individual digital compensation waveform to the output of the input sensor system in parallel with a haptic actuator being driven by a corresponding haptic waveform.

16. In an additional or alternative aspect, the controller is configured to adjust an operating frequency of at least a portion of the input sensor system, to minimize the effect of the vibrational output on the input sensor system.

17. Preferably, the device comprises:
- a memory storage arranged to store a plurality of defined keep-out zones defining frequency bands prone to interference from a vibrational output of the vibrational output system,
- wherein, responsive to a vibrational output of the vibrational output system, the controller is arranged to adjust an operating frequency of the input sensor system to not lie within a defined keep-out zone.

18. In an additional or alternative aspect, the controller is configured to adjust the operation of the vibrational output system such that tones produced by a vibrational output of the vibrational output system do not fall within a predetermined frequency band of the input sensor system.

19. Preferably, the vibrational output system comprises an output PWM amplifier, wherein the amplifier is controlled such that none of the integer harmonic tones of the PWM amplifier fall within a predetermined frequency band of the input sensor system.

20. In an additional or alternative aspect, the controller is configured to blank out the output of the input sensor system while the vibrational output system is providing vibrational output.

21. Preferably, the controller is configured to place the input sensor system in a low power or inactive mode while the vibrational output system is providing vibrational output.

22. In an additional or alternative aspect, the controller is configured to control the output of the vibrational output system such that the vibrational output is provided with intervals of reduced vibrational amplitude, and wherein the input sensor system is controller to sample input data during such intervals of reduced vibrational amplitude.

23. In an additional or alternative aspect, the controller is configured to apply a desensitization window to the input sensor system, such that operational thresholds associated with the are increased and/or a negative gain is applied to sensor signals of the input sensor system, to reduce the impact of a vibrational output on the input sensor system or on any systems using an output of the input sensor system.

24. Preferably, the controller is configured to adjust a duration and/or a desensitization factor of the desensitization window.

25. In an additional or alternative aspect, the controller is configured to implement an adaptive filter to model the effect of a vibrational output has on the input sensor system, and to derive an error signal used to compensate the output of the input sensor signal.

26. In an additional or alternative aspect, the input sensor signal comprises a camera or optical sensor, wherein the controller is configured to perform image stabilization on the output of the camera or optical sensor based at least in part on the vibrational output.

27. In an alternative arrangement, there is provided an integrated haptic system comprising:
- an input sensor module arranged to receive an input from at least one sensor, preferably a force sensing module arranged to receive an input from at least one force sensor;
- a haptic driver module arranged to output a haptic driver signal to at least one haptic actuator; and
- a control module arranged to control the haptic driver module such that the haptic driver signal is based at least in part on the input received from the at least one sensor,
- wherein the control module is further arranged to monitor the haptic driver module and to adjust the operation of the haptic driver module and/or the operation of the input sensor module to minimize the effect of a haptic vibrational output on the input sensor module.

28. There is also provided a host device comprising at least one system or device as described in any of the above numbered statements.

29. A control method for a sensor system comprising the steps of:
- (a) monitoring a haptic vibrational output from a haptic module;
- (b) controlling the operation of the haptic module and/or the operation of an input sensor system to minimize the effect of the haptic vibrational output on the input sensor system.

The invention claimed is:

1. A controller for controlling an operation of a vibrational output system and/or an operation of an input sensor system, wherein the controller is for use in a device comprising the vibrational output system and the input sensor system, the controller comprising:
- an input configured to receive an indication of activation or de-activation of an output of the vibrational output system; and
- an adjustment module configured to adjust the operation of the vibrational output system and/or the operation of the input sensor system based on the indication to reduce an interference expected to be caused by the output of the vibrational output system on the input sensory system;
- wherein the adjustment module is configured to increase a drive amplitude or a power level of the input sensor system responsive to the indication indicating activation of the output of the vibrational output system.

2. The controller of claim 1 wherein the drive amplitude or the power level of the input sensor system is increased such that a signal to noise ratio of the input sensor system meets a minimum threshold.

3. The controller of claim 1 wherein the adjustment module is configured to adjust a bandwidth or conversion time associated with operation of the input sensor system responsive to the indication indicating activation of the output of the vibrational output system.

4. The controller of claim 3 wherein the bandwidth associated with operation of the input sensor system comprises a filtering bandwidth applied to an output signal of the input sensor system, and wherein the adjustment module is configured to reduce the filtering bandwidth responsive to the indication indicating activation of the output of the vibrational output system.

5. The controller of claim 3 wherein the adjustment module is configured to:
obtain a bandwidth or conversion time setting from a memory; and
apply the bandwidth or conversion time setting to the input sensor system whilst the indication indicating activation of the output of the vibrational output system.

6. The controller of claim 1 wherein, the adjustment module is configured to:
responsive to the indication indicating activation of the output of the vibrational output system, obtain a compensation signal from a memory comprising one or more stored compensation signals, wherein the compensation signal is associated with an output signal for output by the vibrational output system; and
apply the compensation signal to a sensor signal output by the input sensor system whilst the output signal is output by the vibrational output system.

7. The controller of claim 1 wherein the adjustment module is configured to:
responsive to the indication indicating activation of the output of the vibrational output system, select an operating frequency of the input sensor system based on an output signal being output by the vibrational output system.

8. The controller of claim 1 wherein the adjustment module is configured to:
responsive to the indication indicating activation of the output of the vibrational output system, select an operating frequency of the input sensor system such that the operating frequency does not lie within a predefined keep-out zone.

9. The controller of claim 1 wherein the adjustment module is configured to blank out an output signal of the input sensor system responsive to the indication indicating activation of the output of the vibrational output system.

10. The controller of claim 9 wherein the adjustment module is configured to blank out the output signal by one or more of: placing the input sensor system in a low power mode, putting the input sensor system in an inactive mode, or ignoring the output signal of the input sensor system whilst the indication indicates activation of the output of the vibrational output system.

11. The controller of claim 1 wherein the adjustment module is configured to, responsive to the indication indicating activation of the output of vibrational output system, adjust the operation of the input sensor system such that the input sensor system performs sensing only during one or more time intervals during which an output signal being output to the vibrational output system has a vibrational amplitude below a predetermined threshold amplitude.

12. The controller of claim 1 wherein the adjustment module is configured to, responsive to the indication indicating activation of the output of vibrational output system, trigger a desensitization window to apply to an output of the input sensor system.

13. The controller of claim 12 wherein the adjustment module is configured to trigger the desensitization window by one or more of:
adjusting a threshold used by the input sensor system to detect an event to reduce the sensitivity of the input sensor system to events; and
applying a negative gain to an output of a sensor in the input sensor system.

14. The controller of claim 1 wherein the adjustment module comprises:
an adaptive filter configured to:
model an effect of an output signal of the vibrational output signal on an output signal of the input sensor system; and
output an error signal based on the model, wherein the error signal is used to compensate the output signal of the input sensor system.

15. A device comprising:
an input sensor system;
a vibrational output system;
a controller configured to control operation of the vibrational output system and/or the input sensor system, wherein the controller comprises:
an input configured to receive an indication indicating activation or deactivation of an output of the vibrational output system; and
an adjustment module configured to adjust operation of the vibrational output system and/or operation of the input sensor system based on the indication to reduce an interference expected to be caused by the output of the vibrational output system on the input sensory system;
wherein the adjustment module is configured to increase a drive amplitude or a power level of the input sensor system responsive to the indication indicating activation of the output of the vibrational output system.

16. The device of claim 15 wherein the vibrational output system comprises a haptic output system configured to provide a haptic output.

17. The device of claim 15 wherein vibrational output system comprises a surface audio output system.

18. The device of claim 15 wherein the input sensor system comprises a force sensing system.

19. The device of claim 18 wherein the force sensing system comprises at least one force sensor selected from one or more of:
a capacitive displacement sensor;
an inductive force sensor;
a strain gauge;
a piezoelectric force sensor;
a force resisting sensor;
a piezoresistive force sensor;
a thin film force sensor; and
a quantum tunnelling composite-based force sensor.

20. The device of claim 15 wherein the input sensor system comprises at least one sensor selected from:
an accelerometer;
a gyroscope;
a microphone transducer;
a camera;
an optical sensor; and
an ultrasonic sensor.

21. An integrated circuit for use in a device comprising an input sensor system and a vibrational output system, the integrated circuit comprising a controller configured to control operation of the vibrational output system and/or the input sensor system, wherein the controller comprises:
- an input configured to receive an indication of whether an output of the vibrational output system is active; and
- an adjustment module configured to adjust operation of the vibrational output system and/or operation of the input sensor system based on the indication;
- wherein the adjustment module is configured to increase a drive amplitude or a power level of the input sensor system responsive to the indication indicating activation of the output of the vibrational output system.

22. A method for use in a device comprising a vibrational output system and an input sensor system for controlling operation of the vibrational output system and/or the input sensor system, the method comprising:
- receiving an indication of whether an output of the vibrational output system is active; and
- adjusting operation of the vibrational output system and/or operation of the input sensor system based on the indication to reduce an interference expected to be caused by the output of the vibrational output system on the input sensor system;
- wherein an adjustment module is configured to increase a drive amplitude or a power level of the input sensor system responsive to the indication indicating activation of the output of the vibrational output system.

* * * * *

UNITED STATES PATENT AND TRADEMARK OFFICE
CERTIFICATE OF CORRECTION

| | | |
|---|---|---|
| PATENT NO. | : 10,976,825 B2 | Page 1 of 1 |
| APPLICATION NO. | : 16/660444 | |
| DATED | : April 13, 2021 | |
| INVENTOR(S) | : Das et al. | |

It is certified that error appears in the above-identified patent and that said Letters Patent is hereby corrected as shown below:

On the Title Page

In Item (72), under "Inventors", in Column 1, Line 3, delete "Michael Allan Kost," and insert
-- Michael A. Kost, --, therefor.

Signed and Sealed this
Eighth Day of November, 2022

Katherine Kelly Vidal
*Director of the United States Patent and Trademark Office*